United States Patent [19]

No

[11] Patent Number: 5,212,627
[45] Date of Patent: May 18, 1993

[54] ELECTRONIC MODULE HOUSING AND ASSEMBLY WITH INTEGRAL HEATSINK

[75] Inventor: Hyo S. No, Buffalo Grove, Ill.

[73] Assignee: Motorola, Inc., Schaumburg, Ill.

[21] Appl. No.: 829,112

[22] Filed: Jan. 31, 1992

[51] Int. Cl.$^5$ .............................................. H05K 7/20
[52] U.S. Cl. .................................... 361/386; 361/388; 361/392; 361/399; 165/80.3; 174/16.3
[58] Field of Search ............... 361/380, 383, 386, 388, 361/392, 393, 394, 395, 399, 400, 406, 408, 411, 415, 417, 419, 421; 174/16.3; 165/80.3; 357/80, 81

[56] References Cited

U.S. PATENT DOCUMENTS

| | | |
|---|---|---|
| D. 284,587 | 7/1986 | Cox et al. |
| 4,901,203 | 2/1990 | Kobayashi et al. .................. 361/395 |
| 4,905,123 | 2/1990 | Windle et al. ....................... 361/388 |

OTHER PUBLICATIONS

"Motorola Solid State Relay/Driver, Advance Information Product Description", Aug. 1990.
"Motorola 25-51 Service Manual, MA/MH and MR Series Alternator Systems", pp. 2, 14, 29, 30, 1969.
"Motorola MAPI Service Bulletin No. 30", Apr. 1969.

*Primary Examiner*—Lincoln Donovan
*Assistant Examiner*—Young S. Whang
*Attorney, Agent, or Firm*—Phillip H. Melamed; John H. Moore

[57] ABSTRACT

An electronic module housing (30) with an integral heatsink (32) is provided as part of an electronic module assembly (31). The heatsink (32) has a general U-shape formed by a pair of opposing sidewalls (33, 34) rising upward from a central intermediate portion (37) having a planar surface (38) for mounting a module substrate thereon. Plastic housing material is molded about the heatsink so as to form an interior module receiving cavity (50). The cavity is generally defined by the heatsink sidewalls (33, 34) and a pair of molded plastic opposing sidewalls (55, 56) provided between the heatsink sidewalls. Preferably heat conductive mounting ear portions (40, 41) extend from ends (43, 44) of the heatsink sidewalls and permit thermally mounting the housing to another heatsinking structure. Preferably molded interior plastic sidewalls (57, 58) separate the heatsink sidewalls (33, 34) from the cavity (50). The preferred housing and assembly configuration has reduced size and weight and provides sufficient mechanical protection and increased thermal power dissipation for a module (39) in the cavity.

20 Claims, 2 Drawing Sheets

ELECTRONIC MODULE HOUSING AND ASSEMBLY WITH INTEGRAL HEATSINK

FIELD OF THE INVENTION

The present invention relates to the field of electronic module housings and assemblies which include such housings. More specifically, the present invention relates the field of such housings and assemblies which include heatsinks.

BACKGROUND OF THE INVENTION

Housings have been provided with an interior cavity for receiving an electronic module wherein the housing provides mechanical protection for the module. Such housings may also protect the module from environmental contaminants by partially or substantially totally sealing the module within an interior housing cavity. If the module must dissipate a substantial amount of power, the housing may also have to provide a heatsink function or at least permit the module in the housing to be connected to a heatsink. Some prior housings have combined the protection and heatsink requirements by essentially constructing the housing in the form of a metal box configuration having one open side to permit mounting the module within the formed metal box.

A combined metal box housing and heatsink configuration, such as noted above, generally results in the housing have a substantial weight which may be undesirable in many applications. In addition, such a configuration also presents potential problems in providing external electrical access to the module contained within the housing while also sealing the module against external environmental containments. Also, when providing an all metal box type housing structure, care must be taken to avoid undesired electrical shorting of the module within the housing to the metal box sidewalls of the housing unless the metal box is made substantially larger than the electronic module. Increasing housing size to avoid this potential problem is undesirable since this will increase both the size and weight of the housing.

A prior art combined housing and heatsink configuration has been suggested which involves providing a heatsink block having convective cooling fins and then molding around a portion of this heatsink block four plastic sidewalls to define an interior module receiving cavity. This suggested structure is shown in FIGS. 1 and 2 of the present application. This prior structure provides a pair of plastic molded mounting ears having holes therethrough to provide for mounting the combined housing and heatsink structure. With regard to the combined housing and heatsink shown in FIGS. 1 and 2, while this structure substantially reduces the total weight of the housing which would be required for an all metal box type structure, the amount of heatsink capacity provided by this structure has been found to be somewhat limited since convective cooling fins provided as part of the heatsink block can provide only a limited amount of cooling for a module mounted within the housing. Also, it is necessary to accurately control the mounting torque when installing this type of housing to prevent cracking the plastic mounting ears of such a housing.

What is needed is an improved housing having heatsink capability which overcomes the above mentioned disadvantages of the prior housings.

SUMMARY OF THE INVENTION

An electronic module housing having an integral heatsink is provided. The housing includes: a heatsink having a general U-shape configuration formed by a pair of upstanding opposing sidewalls rising upward from opposite ends of a central intermediate portion, the central intermediate portion having a planar surface suitable for mounting a substantially planar module substrate thereon; and plastic housing material molded about and contacting the heatsink and forming an interior module receiving cavity, the interior cavity having an open side and generally defined by the pair of upstanding opposing heatsink sidewalls, the central intermediate portion of the heatsink and a pair of molded plastic opposing sidewalls provided between and extending between the pair of heatsink sidewalls. By providing the electronic module housing as described above, the heatsink provides a planar surface for mounting a module substrate thereto while the heatsink sidewalls can conduct heat away from the substrate and the heatsink and plastic sidewalls provide protection for components in the interior cavity.

The preferred embodiment of the present invention contemplates the heatsink sidewalls each having a heat conductive ear portion with a hole therethrough to allow mounting the housing to an additional heat conductive component and thereby conducting heat away from the central intermediate portion to which a module substrate may be mounted. Since these mounting ears are part of the heatsink and are therefore preferably formed of heat conducting metal, this avoids cracking the mounting ears when mounting the housing to another structure. Preferably heatsink convective cooling fins are also provided to enable the heatsink to dissipate heat by both convection and conduction. In addition, interior molded plastic sidewalls are provided on the heatsink sidewalls and separate them from the interior cavity thus avoiding potential electrical shorts from the module to the heatsink sidewalls.

The above noted features result in providing a compact and inexpensive single component electronic module housing having an integral heatsink. The configuration of the present preferred embodiment minimizes the size of the housing while providing extensive heatsink capacity and avoiding the above discussed disadvantages of prior housings having an integral heatsink. Preferably, an assembly using such a housing is provided wherein an electronic circuit module is provided within the heatsink interior cavity. A substrate of the circuit module is planarly and thermally conductively mounted to the planar surface provided on the heatsink central intermediate portion.

BRIEF DESCRIPTION OF THE DRAWINGS

The present invention can be better understood by reference to the drawings in which.

DESCRIPTION OF THE PREFERRED EMBODIMENTS

Figure 1:
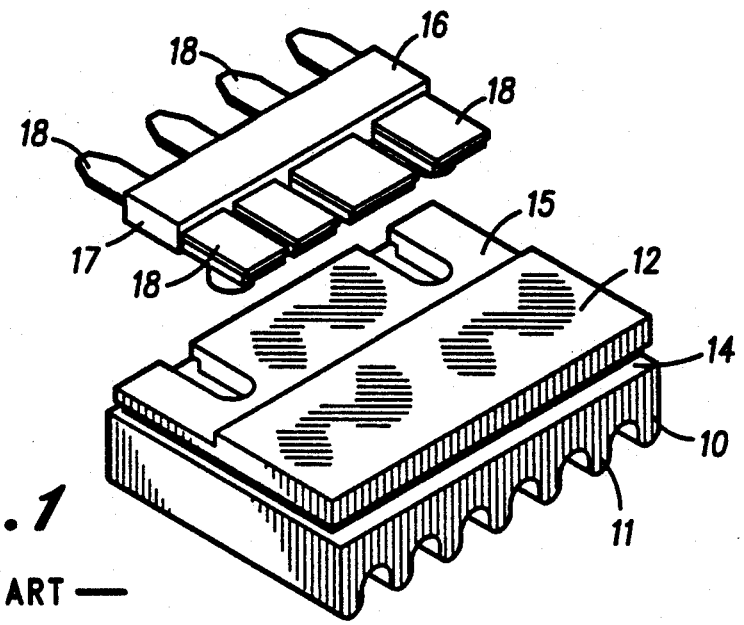
FIG. 1 is a perspective view of a molded connector pin subassembly and heatsink block which are part of a prior electronic module housing.
Figure 2:
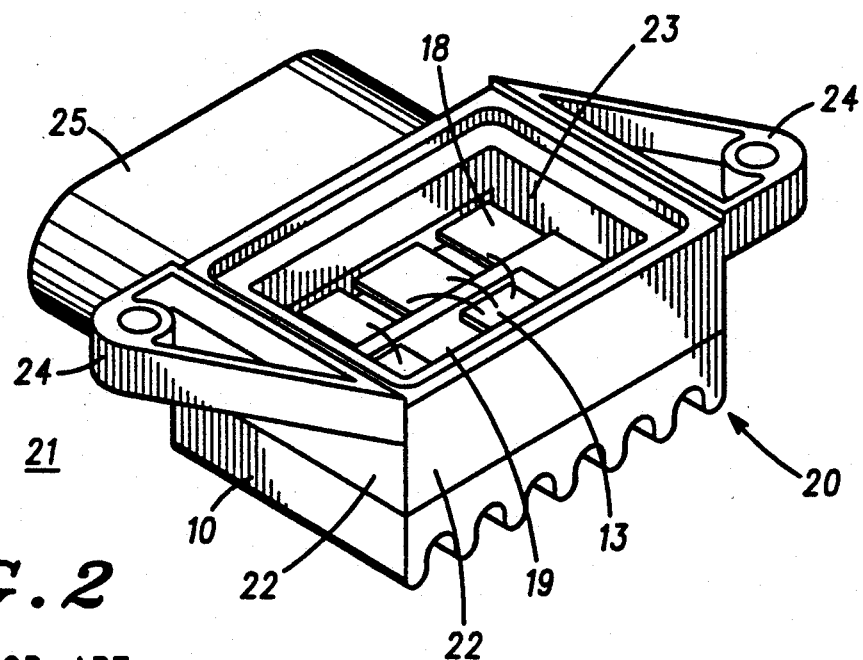
FIG. 2 is a perspective view of a prior electronic module housing which utilizes the components shown in FIG. 1.

Referring to FIGS. 1 and 2, the configuration of a prior electronic module housing and assembly is illustrated wherein the present invention represents an improvement over this configuration. FIG. 1 illustrates an aluminum heatsink block 10 having a plurality of convective cooling fins 11 provided on a bottom surface of the block 10. A planar surface 12 is provided on which a substrate of an electronic circuit module 13 (shown in FIG. 2) will be thermally conductively mounted. A peripheral recess groove 14 is provided as part of the heatsink block 10 and an additional planar surface 15 is provided which is parallel to and somewhat lower than the planar surface 12. FIG. 1 also illustrates a plastic molded connector pin subassembly 16 having a main plastic body 17 and a plurality of connector pins 18 projecting through the plastic body 17. The plastic body 17 is intended for mounting on the planar surface 15 such that portions of the connector pins 18 will be positioned above or in contact with conductor pads provided on a ceramic substrate 19 that forms the base substrate for the electronic circuit module 13.

The heatsink block 10 and subassembly 16 shown in FIG. 1 are mated to each other and then a plastic over molding process is performed so as to form an electronic module housing 20 shown in FIG. 2. The housing 20 forms part of an electronic module assembly 21 shown in FIG. 2. The housing 20 comprises four molded plastic sidewalls 22 which are formed about the heatsink block 10. The peripheral groove 14 provides a recess to ensure attachment of the sidewalls 22 to the heatsink block 10. The four plastic sidewalls 22, together with the surfaces 12 and 15 of the heatsink block, form five sides of an interior cavity 23 in which the circuit module 13 is provided and into which portions of the pins 18 extend. A pair of plastic mounting ears 24 extend from an opposing pair of the sidewalls 22 to permit mounting the assembly 21 to another structure. A plastic connector pin shroud 25 is also formed during the molding process to protect ends of the pins 18 that are external to the cavity 23. Electrical bonding wires are provided between portions of the pins 18 within the cavity and conductor pads on the substrate 19. While no cover is shown in FIG. 2, preferably the assembly 21 will have a cover to close the interior cavity 23.

The prior art assembly and housing shown in FIGS. 1 and 2 has the advantage of minimizing the weight of the protective housing for the circuit module 13 while providing some heatsink capability for the module. However, when such a configuration is utilized for a high power circuit module, such as a solid state relay, due to the limited amount of heatsinking capability provided by the heatsink 10, only a limited maximum current capability is provided for the module. Many times a larger maximum current capability is required, but substantially increasing the size of housing is not desirable. Also, providing plastic mounting ears for the assembly and housing of FIG. 2 requires careful process control to avoid cracking the plastic mounting ears during mounting the assembly to another structure due to the use of excessive torque in screwing the mounting ears to another structure.

Figure 3:
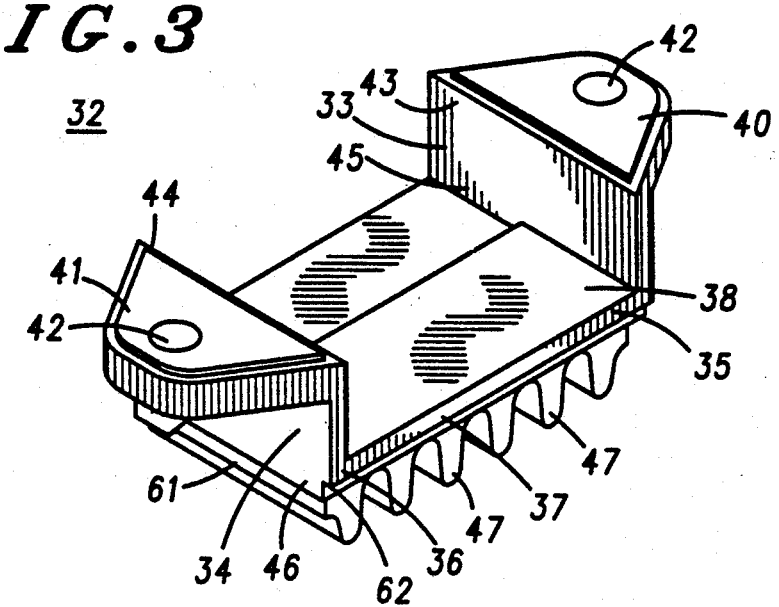
FIG. 3 is a perspective view of a heatsink formed in accordance with a preferred embodiment of the present invention.
Figure 4:
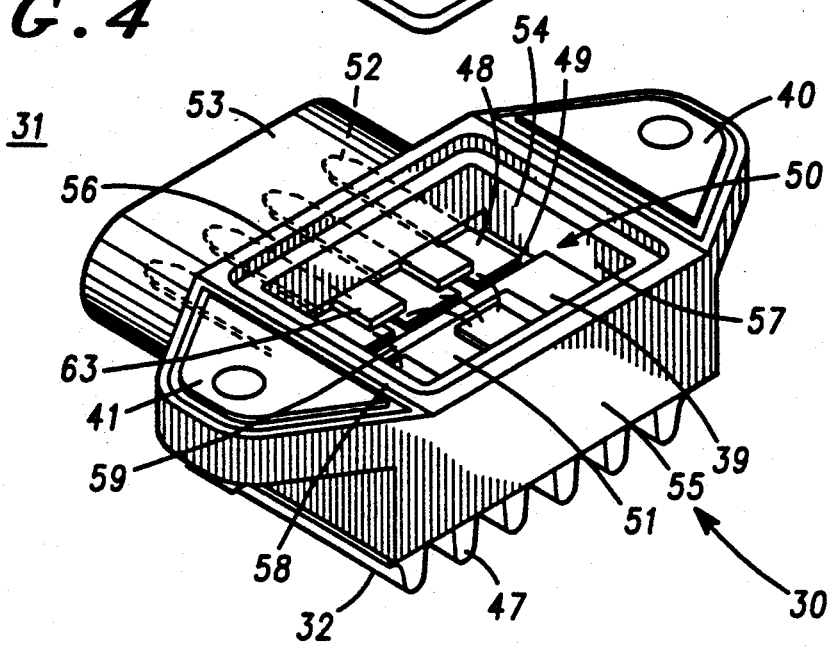
FIG. 4 is a perspective view of an electronic module assembly, with its cover removed, which utilizes the heatsink in FIG. 3 as part of an electronic module housing.

FIGS. 3 and 4 illustrate the configuration of an improved electronic module housing 30 and an improved electronic module assembly 31 which uses the housing 30. Referring to FIG. 3, a heatsink 32 is illustrated as having a general U-shape configuration formed by a pair of upstanding opposing sidewalls 33 and 34 which rise upward from opposite ends 35 and 36, respectively, of a central intermediate portion 37 of the heatsink. The central intermediate portion 37 has a planar surface 38 suitable for mounting a substantially planar ceramic module substrate 39 (shown in FIG. 4) thereon. Each of the sidewalls 33 and 34 have an associated heat conductive ear portion 40 and 41, respectively, extending from the sidewall parallel to the central portion planar surface 38. Each of the ear portions 40 and 41 have at least one through hole 42 therein to permit thermal conductive mounting of the heatsink 32 to another heat conductive structure. Each of the ear portions 40 and 41 extend in opposite directions with respect to one another from ends 43 and 44 of the heatsink sidewalls 33 and 34, respectively. The ends 43 and 44 are opposite ends 45 and 46, respectively, of the sidewalls 33 and 34, and ends 45 and 46 are positioned adjacent the central intermediate portion 37 of the heatsink 32.

Preferably, the entire heatsink 32 shown in FIG. 3 comprises a single unitary metal structure at least substantially formed from aluminum. Preferably, the central intermediate portion 37 of the heatsink 32 includes external heatsink convective cooling fins 47 that are positioned between the upstanding heatsink sidewalls 33 and 34 and extend from a surface of the heatsink central intermediate portion 37 located below the heatsink planar surface 38.

The heatsink 32 shown in FIG. 3 is preferably utilized as a component in the electronic module housing 30 shown in FIG. 4 wherein plastic housing material is overmolded about portions of the heatsink 32 to form the housing 30. During this molding process connector pins 48 are also overmolded such that they have end portions 49 which extend into an interior module receiving cavity 50 in which the planar module substrate 39, and other components, of an electronic module 51 will be positioned. End portions 52 of the pins 48 are also provided within a plastic molded connector shroud 53 formed during the overmolding process wherein the end portions 52 are external to the interior cavity 50. This is accomplished in the following manner.

Plastic housing material is molded about and contacts the heatsink 32 so as to form the interior module receiving cavity 50. This cavity has an open side 54 and is generally defined by the pair of upstanding opposing heatsink sidewalls 33 and 34 and a pair of molded plastic opposing sidewalls 55 and 56 provided between and extending between the pair of heatsink sidewalls 33 and 34. The heat conductive ear portions 40 and 41 of the heatsink 32 extend away from the interior cavity 50 and the heatsink convective cooling fins 47 also extend from the central intermediate portion 37 away from the interior cavity 50.

It is contemplated that the plastic sidewalls 55 and 56 and the plastic connector shroud 53 are all formed as part of the same plastic overmolding process. This process also includes forming interior plastic sidewalls 57 and 58 which are provided on said heatsink sidewalls 33 and 34, respectively, and separate these heatsink sidewalls from the interior cavity 50. The resultant structure comprises a continuous sidewall plastic shell peripheral structure formed by the interior plastic sidewalls 57 and 58 and the pair of opposing plastic sidewalls 55 and 56. These plastic sidewalls form the interior boundaries of the interior cavity 50 with the heatsink central intermediate portion 37 closing one open end of this sidewall plastic shell peripheral structure leaving the open side 54 forming the other end of the peripheral structure. The use of the interior plastic sidewalls 57 and 58 aids in electrically insulating the circuit module 51 and connector pins 48 from the heatsink sidewalls 33 and 34 while thermal conductivity to the sidewalls 33 and 34 is provided via the central intermediate portion 37 of the heatsink. This configuration also assists in minimizing thermal expansion mismatch stresses that may be set up between the plastic molding material and the heatsink.

As shown in FIG. 4, the module substrate 39 of the module 51 is thermally conductively planarly mounted on the planar surface 38 of the heatsink. This occurs after the plastic overmolding process used to form the housing 30. Bonding wires 59 connect conductor pads on the substrate 39 to the end portions 49 of the connector pins 48 that are provided within the cavity 50. A removable cover 60 is illustrated in FIG. 4 above the cavity 50 wherein this separate cover will contact at least the plastic molded sidewalls 55 and 56 and close the open side 54 of the cavity 50 thereby sealing the cavity against environmental contaminants.

The above noted structure allows substantially greater heatsink capacity for the electronic module housing 30 and its resultant assembly 31. This is because heatsinking is now not only provided by the convective cooling fins 47, but also by the upstanding heatsink walls 33 and 34 and their potential heatsinking connection via the heatsink ears 40 and 41 to other heatsinking structure. Thus a combined convection cooling and thermal conduction effect has been provided which draws heat away from the ceramic substrate 39 of the electronic module 51 and provides substantial heatsinking capacity. This has been found to provide a substantial increase in the maximum current capability for a solid state relay used in the electronic module assembly 31 as contrasted with the assembly 21 shown in FIGS. 1 and 2. In addition, the providing of the interior plastic sidewalls 57 and 58 electrically insulates the heatsink sidewalls from components within the interior cavity 50 and thereby prevents accidental shorting of these components, and the pins 48, to the heatsink sidewalls. The providing of the heatsink as a U-shape configuration minimizes the total weight of the assembly since it has been found unnecessary to surround the internal cavity by four heat conducting heatsink sidewalls. Protection for the cavity 50 is accomplished by the pair of plastic sidewalls 55 and 56 in combination with the plastic sidewalls 57 and 58 and the pair of heatsink sidewalls 33 and 34 together with the central intermediate portion 37 of the heatsink and the cover 60.

It should be noted that overhanging lips or ridges 61 and 62 of the heatsink 32 are provided so as to ensure the gripping of the molded plastic to the heatsink 32. In addition, preferably molded plastic projections 63 are provided on the top side of the connector pins 48 with regard to some of the portions 49 of these pins that extend into the cavity 50. The bottom sides of these pins are already supported by molded plastic. This configuration helps rigidize the pins and prevents their movement during the making of electrical connections to the circuit module 51 via the bonding wires 59.

Also, because the mounting holes 42 are provided in heat conductive ear portions 40 and 41 of the heatsink 32, wherein the heatsink is preferably a metal structure, it is no longer necessary to be concerned about cracking the mounting ear portions due to excessive use of torque during the mounting process. The metal ear portions 40 and 41 can easily withstand substantial amounts of mounting torque unlike the plastic ear portions 24 shown in FIG. 2. In addition, preferably the housing 30 will not require the use of a molded pin subassembly such as subassembly 16 since the plastic forming the housing 30 can be directly molded around the pins 48.

While I have shown and described specific embodiments of this invention, further modifications and improvements will occur to those skilled in the art. All such modifications and improvements which retain the basic underlying principles disclosed and claimed herein are within the scope of this invention.

I claim:

1. An electronic module housing with an integral heatsink, comprising:
   a heatsink having a general U-shape configuration formed by a pair of upstanding opposing heatsink sidewalls rising upward from opposite ends of a central intermediate portion, said central intermediate portion having a planar surface suitable for mounting a substantially planar module substrate thereon; and
   plastic housing material molded and contacting said heatsink and forming an interior module receiving cavity, said interior cavity having an open side and generally defined by said pair of upstanding opposing heatsink sidewalls, said central intermediate portion of said heatsink and a pair of molded plastic opposing sidewalls provided between and extending between said pair of heatsink sidewalls, said pair of molded plastic opposing sidewalls rising upward from said central intermediate portion of said heatsink, whereby said heatsink provides said planar surface for mounting a module substrate thereto while said heatsink sidewalls can conduct heat away from said substrate and said heatsink and plastic sidewalls provide protection for components in said interior cavity.

2. A housing according to claim 1 wherein said heatsink sidewalls each have a heat conductive ear portion extending therefrom parallel to said central portion planar surface and away from said interior cavity.

3. A housing according to claim 2 wherein each of said ear portions has at least one hole therethrough to permit thermal conductive mounting of said heatsink to another structure.

4. A housing according to claim 3 wherein each of said ear portions extend in opposite directions from one another from ends of said heatsink sidewalls opposite ends of said heatsink sidewalls positioned adjacent said central intermediate portion of said heatsink.

5. A housing according to claim 4 which includes a separate cover which contacts at least said molded plastic sidewalls and closes said open side of said interior cavity.

6. A housing according to claim 5 wherein said cover is removeable.

7. A housing according to claim 5 wherein said heatsink central portion includes exposed external heatsink convective cooling fins which are provided exterior to and extend away from said internal cavity.

8. A housing according to claim 7 wherein said heatsink convective cooling fins are positioned between said upstanding heatsink sidewalls and extend from a surface of said heatsink central portion below said heatsink planar surface of said heatsink central portion.

9. A housing according to claim 8 wherein said heatsink comprises a single unitary metal structure.

10. A housing according to claim 9 wherein said heatsink is at least substantially formed from aluminum.

11. A housing according to claim 1 which includes a plurality of separate metal lead frame fingers which extend through at least one of said molded plastic sidewalls into said interior cavity, said metal lead frame fingers having end portions which are external with respect to said interior cavity.

12. A housing according to claim 1 wherein molded interior plastic sidewalls are provided on said heatsink sidewalls and separate said heatsink sidewalls from said interior cavity.

13. A housing according to claim 12 wherein said interior plastic sidewalls and said pair of opposing plastic sidewalls are integral and form a continuous side walled plastic shell peripheral structure which generally forms interior boundaries of said interior cavity, said heatsink central portion closing one open end of said side walled plastic shell peripheral structure.

14. An electronic module assembly with an integral heatsink, comprising:
a heatsink having a general U-shape configuration formed by a pair of upstanding opposing heatsink sidewalls rising upward from opposite ends of a central intermediate portion, said central intermediate portion having a planar surface suitable for mounting a substantially planar module substrate thereon;
plastic housing material molded and contacting said heatsink and forming an interior module receiving cavity, said interior cavity having an open side and generally defined by said pair of upstanding opposing heatsink sidewalls, said central intermediate portion of said heatsink and a pair of molded plastic opposing sidewalls provided between and extending between said pair of heatsink sidewalls, said pair of molded plastic opposing sidewalls rising upward from said central intermediate portion of said heatsink, whereby said heatsink provides said planar surface for mounting a module substrate thereto while said heatsink sidewalls can conduct heat away from said substrate and said heatsink and plastic sidewalls provide protection for components in said interior cavity; and
circuit module which includes a substantially planar heat conductive substrate, said substrate planarly and heat conductively mounted to said central intermediate portion planar surface.

15. An assembly according to claim 14 wherein said heatsink sidewalls each have a heat conductive ear portion extending therefrom parallel to said central portion planar surface and away from said interior cavity, and wherein each of said ear portions has at least one hole therethrough to permit thermal conductive mounting of said heatsink to another structure, and wherein each of said ear portions extend in opposite directions from one another from ends of said heatsink sidewalls opposite ends of said heatsink sidewalls positioned adjacent said central intermediate portion of said heatsink.

16. An assembly according to claim 15 which includes a separate cover which contacts at least said molded plastic sidewalls and closes said open side of said interior cavity.

17. An assembly according to claim 16 wherein said heatsink central portion includes exposed external heatsink convective cooling fins which are provided exterior to and extend away from said internal cavity, and wherein said heatsink convective cooling fins are positioned between said upstanding heatsink sidewalls and extend from a surface of said heatsink central portion below said heatsink planar surface of said heatsink central portion.

18. An assembly according to claim 17 wherein said heatsink comprises a single unitary metal structure and wherein said heatsink is at least substantially formed from aluminum.

19. An assembly according to claim 14 which includes a plurality of separate metal lead frame fingers which extend through at least one of said molded plastic sidewalls into said interior cavity, said metal lead frame fingers having end portions which are external with respect to said interior cavity, said assembly including electrical connection means electrically connecting portions of said lead frame fingers in said interior cavity to said circuit module.

20. An assembly according to claim 14 wherein molded interior plastic sidewalls are provided on said heatsink sidewalls and separate said heatsink sidewalls from said interior cavity and said module substrate.

* * * * *